United States Patent
Dwivedi et al.

(10) Patent No.: US 10,530,366 B1
(45) Date of Patent: Jan. 7, 2020

(54) LOW VOLTAGE DIFFERENTIAL SIGNALING FAULT DETECTOR

(71) Applicant: STMicroelectronics International N.V., Schiphol (NL)

(72) Inventors: Atul Dwivedi, Benares (IN); Paras Garg, Noida (IN); Kallol Chatterjee, Kolkata (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/503,960

(22) Filed: Jul. 5, 2019

Related U.S. Application Data

(60) Provisional application No. 62/695,394, filed on Jul. 9, 2018.

(51) Int. Cl.
*H03K 19/007* (2006.01)
*H03K 19/0185* (2006.01)
*G01R 31/317* (2006.01)

(52) U.S. Cl.
CPC .............. *H03K 19/018528* (2013.01); *G01R 31/31706* (2013.01)

(58) Field of Classification Search
None
See application file for complete search history.

(56) References Cited

U.S. PATENT DOCUMENTS

| 6,781,456 B2 | 8/2004 | Pradhan |
| 2016/0127084 A1 | 5/2016 | Jansen et al. |

OTHER PUBLICATIONS

Morgan, Mark et al: "Active Fail-Safe in TI's LVDS Receivers," Texas Instruments Application Report, SLLA082B, Oct. 2001 (10 pages).

*Primary Examiner* — Anh Q Tran
(74) *Attorney, Agent, or Firm* — Crowe & Dunlevy

(57) ABSTRACT

A low-voltage-differential-signaling (LVDS) fault detector includes first and second LVDS lines, and a window comparator provides a first output indicating whether a difference between voltages at the first and second LVDS lines is greater than a threshold voltage, and a second output indicating whether a difference between the voltages at the second and first LVDS lines is greater than the threshold voltage. A charge circuit charges a capacitive node when either the first or second output is at a logic low, and discharges the capacitive node when neither the first nor second output is at a logic low. A Schmitt trigger generates a fault flag if charge on the capacitive node falls to a threshold.

20 Claims, 8 Drawing Sheets

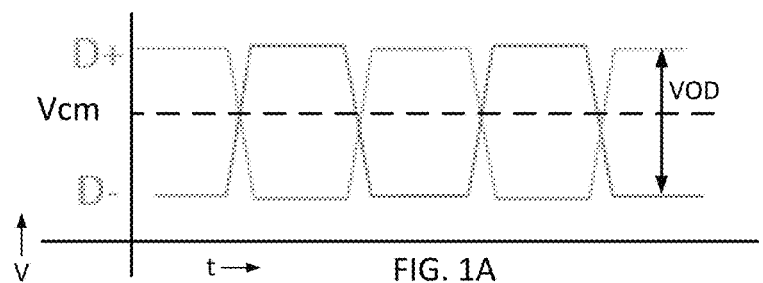
FIG. 1A
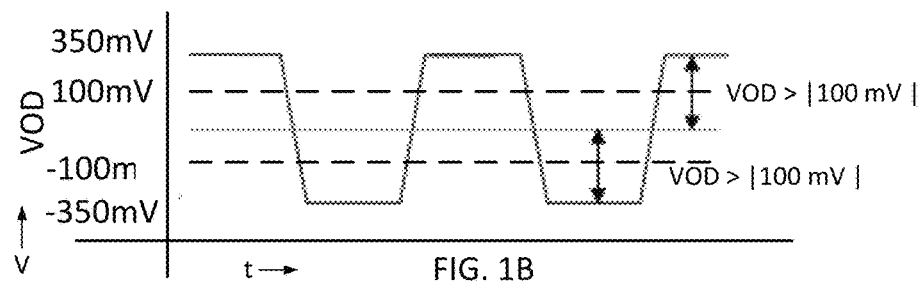
FIG. 1B
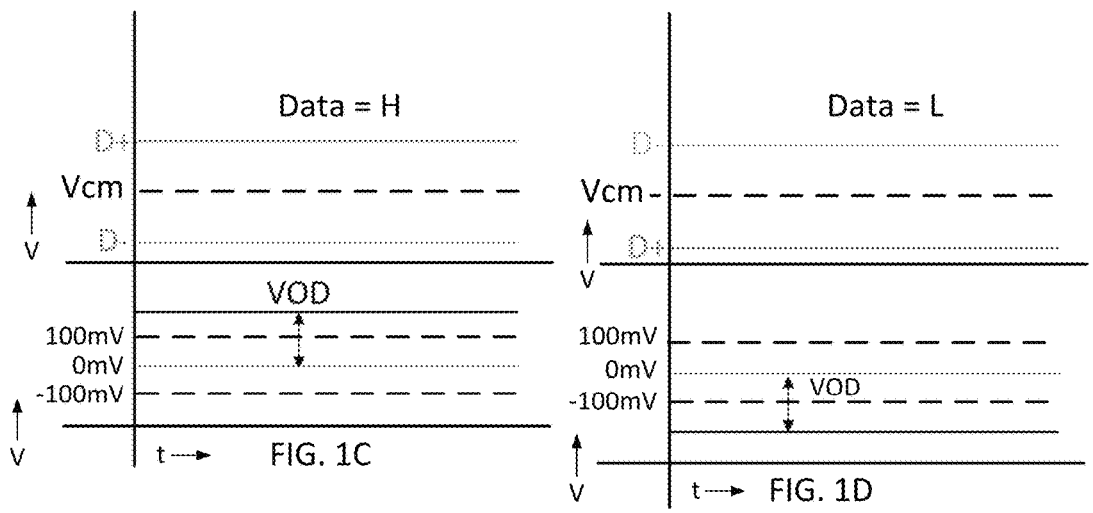
FIG. 1C
FIG. 1D

PAD voltages

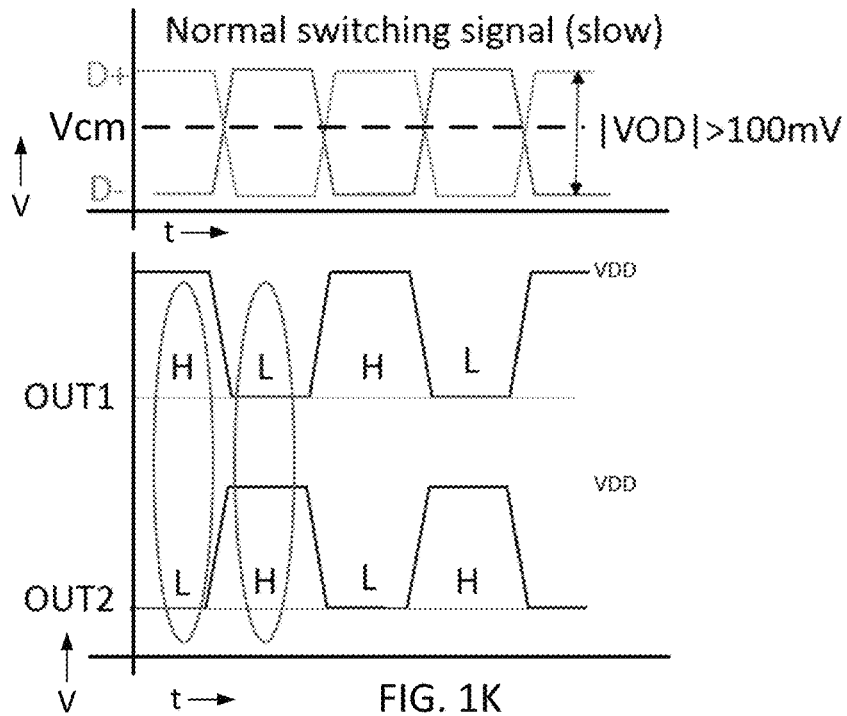
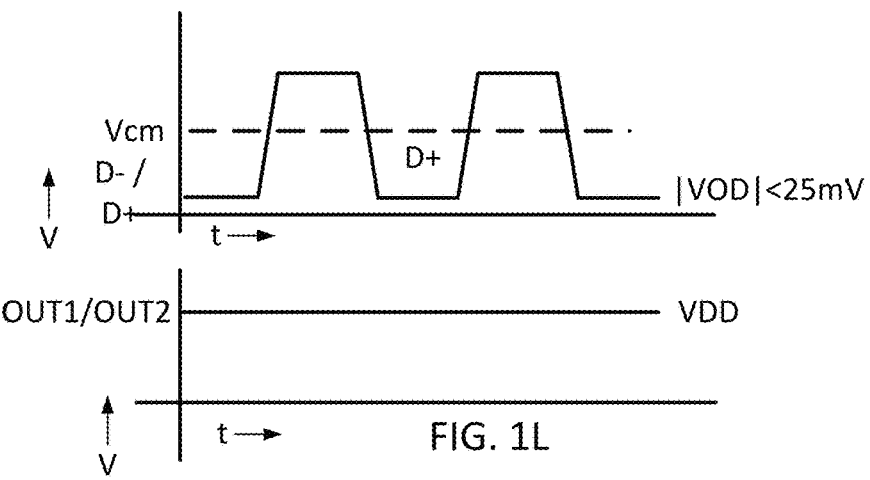
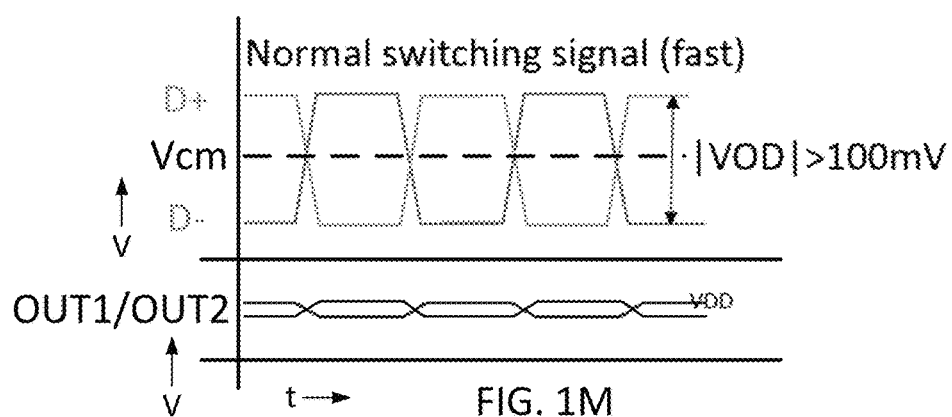

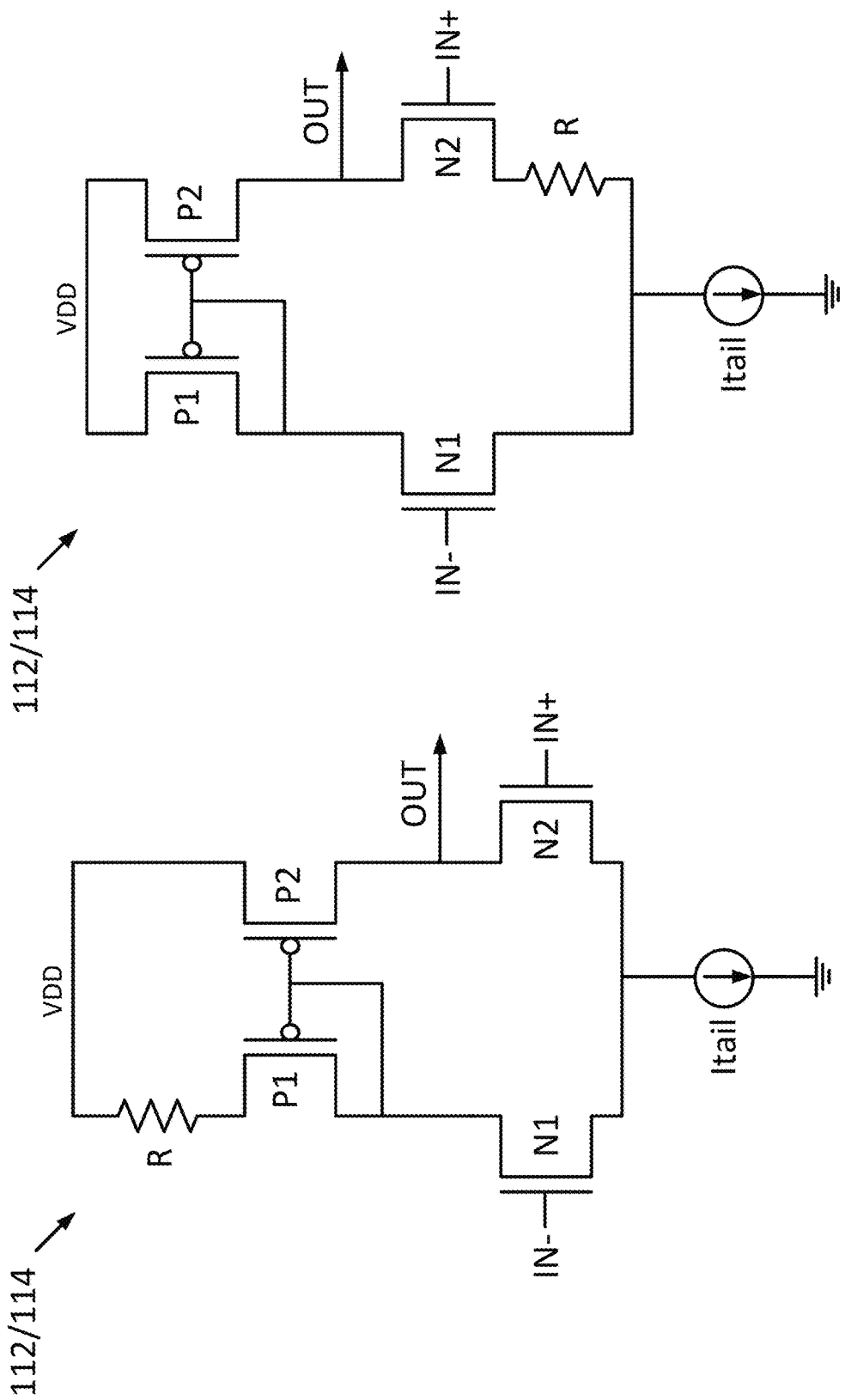

LOW VOLTAGE DIFFERENTIAL SIGNALING FAULT DETECTOR

RELATED APPLICATION

This application claims priority to U.S. Provisional Application for Patent No. 62/695,394, filed Jul. 9, 2018, the contents of which are incorporated by reference in their entirety.

TECHNICAL FIELD

This disclosure is related to the field of error detection in low voltage differential signaling (LVDS) systems.

BACKGROUND

Originally introduced in 1994, low voltage differential signaling (LVDS) has now become commonly used for data transfer in products such as LCD TVs, automotive infotainment systems, industrial cameras, machine vision, notebook and tablet computers, and communications systems. Typical applications include high-speed video, graphics, video camera data transfers, space applications, and general purpose computer buses.

Since LVDS is a differential signaling system, it transmits information as the difference between the voltages on a pair of lines; these two line voltages are compared at a LVDS receiver receiving a LVDS signal. In a typical implementation, a LVDS transmitter injects a constant current into the lines, with the direction of current determining the logic level being communicated. The current passes through a termination resistor (matched to the cable's characteristic impedance to reduce reflections) at the receiving end, and then returns in the opposite direction via the other line. The LVDS receiver senses the polarity of the voltage across the resistor to determine the logic level being communicated. This provides for the transmission of binary data.

Shown in FIG. 1A is a waveform of typical operation of a pair of lines used in LVDS, with one line labeled as D+, and the other labeled as D−, switching about a common mode voltage Vcm. It can be seen that the logic levels of the lines D+ and D− are complementary.

The differential voltage VOD between the D+ and D− lines of FIG. 1A in operation can be seen in FIG. 1B, where it can be observed that the absolute value of the differential voltage VOD in this example is greater than a threshold of 100 mV (for most of the time) when the differential signals on the lines D+ and D− are arriving in a normal condition. As shown in FIG. 1C, in DC conditions, for the communication of a logic high, the D− line will have a voltage of Vcm-VOD/2, while the D+ line will have a voltage equal to Vcm+VOD/2. As shown in FIG. 1D, the differential voltage VOD is greater than a threshold of 100 mV. Similarly, for the communication of a logic low, the D− line will have a voltage of Vcm+VOD/2, while the D+ line will have a voltage of Vcm-VOD/2 V, meaning that the differential voltage VOD is less than a threshold of −100 mV.

Faults or failures with the D+ and D− lines may occur. Potential faults include both lines being open and disconnected from the transmitter, the lines being shorted and disconnected from the transmitter, the lines being shorted but connected to the transmitter, and one line being cut while the other line receives the signal.

When operation becomes abnormal in the presence of a fault, the voltages on the D− and D+ lines may be very close to each other in certain fault conditions, as shown in FIG. 1E, with the resulting differential voltage VOD being approximately 0 mV, as shown in FIG. 1F. This type of fault shown in FIGS. 1E-1F is where the lines D− or D+ have been shorted, or both lines are open.

An example of a fault in which one line is cut while the other continues to switch (with the switching frequency on the lines being high) is shown in FIG. 1G, where the D+ line is cut, but the D− line continues to switch. As can be seen, the voltage on the D+ follows that of the D− line, but with a delay, due to line capacitance and a terminal resistor of the line. Here in this example, the absolute value of VOD is never above a threshold of 100 mV, but it should be noted that this value can be higher in case the fault in line is located away from the receiver. Another example of a cut line fault would be there the D+ line is cut, but the D− line continues to switch, and the switching frequency on the lines is low, as shown in FIG. 1H. Here, it can be seen that the D+ line follows the D− line without delay, so VOD is zero.

From the fault conditions shown in FIGS. 1E-1H, it can be understood that faults on the lines D− and D+ can generally be determined where the absolute value of VOD is below a set threshold, with the possible exception of one line being cut and line switching speed being high (FIGS. 1G-1H). As a consequence, in the prior art it is known to use a window comparator to determine fault conditions. This window of normal operation and fault is depicted in FIG. 1I.

A circuit diagram for a prior art window comparator 1 is shown in FIG. 1J. Here, a first comparator 2 has its non-inverting terminal coupled to receive the D+ line through an offset (25 mV in this example), and has its inverting terminal coupled to receive the D− line. A second comparator 3 has its non-inverting terminal coupled to receive the D− line through the same offset value, and has its inverting terminal coupled to receive the D+ line. The output of the first comparator 2 is shown as OUT1, while the output of the second comparator 3 is shown as OUT2. The purpose of the offset is to set a threshold differentiating between a differential voltage VOD indicating normal operation and a differential voltage VOD indicating faulty operation. Here, the differential voltage VOD having an absolute value of less than the offset of 25 mV will be considered a faulty operation. In normal operation, one of the comparators 2 and 3 will output a logic high, and one will output a logic low, and these will switch when the voltage on the D+ and D− lines switches. In the presence of a fault, however, both comparators 2 and 3 will output a logic high due to the offsets (since VOD is below the threshold), and detection of a logic high from both comparators indicates error.

Normal operation of the window comparator 1 is shown in FIG. 1K. Here, the D+ and D− lines can be seen to be switching normally, with the absolute value of VOD being greater than 100 mV. This produces clean digital outputs OUT1 and OUT2 from the comparators 2 and 3, which clearly show the voltage levels communicated. This normal operation is at a lower frequency.

A fault condition where one line is cut at low frequency is now described with reference to FIG. 1L. Here, the D+ line has been cut, but the D− line continues to switch. Therefore, as explained, since the absolute value of VOD is zero, both OUT1 and OUT2 are pulled high. The window comparator 1 works well to detect faults, and the OUT1 and OUT2 values can be used to distinguish between fault and normal conditions by using suitable logical AND or exclusive-OR (XOR) digital gates.

A problem arises at higher frequencies, even under normal operating conditions. Shown in FIG. 1M is a scenario where the D+ and D− lines are properly switching at high frequency, with the absolute value of the differential voltage VOD being greater than a threshold of 100 mV. Unfortunately, these higher frequencies are outside the bandwidth of the comparators 2 and 3, resulting in the outputs OUT1 and OUT2 of the comparators 2 and 3 barely changing, and OUT1 and OUT2 effectively remaining pulled high. As a result, a test circuit reading the outputs OUT1 and OUT2 of the comparators 2 and 3 would erroneously assume improper operation of the LVDS system.

One attempt at designing a window comparison system that corrects these issues was made by Texas Instruments, described in a publication entitled "Active Fail-Safe in TI's LVDS Receivers", by Mark Morgan and Bryan Smith, published in October 2001 (incorporated by reference).

A circuit diagram for this window comparison system 5 can be seen in FIG. 1N, and includes a main receiver 6 coupled to receive data from LVDS signals A and B. A window comparator 12 is included, and is comprised of comparators 7 and 8. The comparator 7 has the B line coupled to its non-inverting input and the A line coupled to its inverting input, while the comparator 8 has the A line coupled to its non-inverting input and the B line coupled to its inverting input. These comparators 7 and 8 have an offset of 80 mV, meaning that comparator 7 will pull its output high when the voltage on A is greater than the voltage of B by more than 80 mV, and the comparator 8 will pull its output high when the voltage on B is greater than the voltage on A by more than 80 mV. A NAND gate 10 receives the outputs from the comparators 7 and 8 and from the fail safe timer 9.

The fail safe timer 9 receives output from the main receiver 6. The fail safe timer 9 runs until it times out, but can be reset to continue to run (or to start running again if timed out) by toggling of the main receiver 6. While running, the fail safe timer 9 outputs a logic low. When the fail safe timer 9 times out, the output of the fail safe timer 9 is pulled high. Therefore, the purpose of the fail safe timer 9 is to mask the output signals from the comparators 7 and 8 as long as the receiver is toggling (since the output of the NAND gate 10 will be high regardless of the outputs of the comparators 7 and 8 if the output of the fail safe timer 9 is low), and to allow the NAND comparison of the output signals from the comparators 7 and 8 once the fail safe timer 9 has timed out (since the output of the NAND gate 10 will be a result of a NAND operation between the outputs of the comparators 7 and 8 if the output of the fail safe timer 9 is high).

NAND gate 11 receives the output of the main receiver 6 as input, as well as the output of the NAND gate 10. NAND gate 11 is not part of the fault detection, but uses the fault information provided by NAND gate 10 to selectively mask or unmask the output of the main receiver 6. If a fault is found to be present, after the fail safe timer 9 times out and pulls its output high, the NAND gate 10 pulls its output low (as its other inputs, the output of comparators 7 and 8, are by now settled to logic high owing to the fault condition), with the result being that the output of the NAND gate 11 will be high at all times. If a fault is not found to be present, the NAND gate 10 pulls its output high, with the result being that the output of the NAND gate 11 follows the output of the main receiver 6.

The window comparison system 5 has drawbacks and is not suitable in all situations. For example, the window comparison system 5 is reliant on the main receiver 6 operating properly. The main receiver 6 is also sensitive to external noise. If external noise is large enough to cause the main receiver 6 to switch (even in a fault conditions), the fail safe timer 9 is reset, and the fault detection provided by the window comparator 12 is kept disabled (masked by the NAND gate 10) until the input noise becomes insufficient to cause the main receiver 6 to switch for the entire period of the fail safe timer 9.

Therefore, further development on window comparison systems is needed so as to develop window comparison systems without these and other drawbacks.

SUMMARY

Disclosed herein is a low voltage differential signaling (LVDS) fault detection circuit. The LVDS fault detection circuit includes a first input receiving a first input signal indicating whether a voltage at a first LVDS line is greater than a voltage at a second LVDS line by more than an offset voltage, a second input receiving a second input signal indicating whether the voltage at the second LVDS line is greater than the voltage at the first LVDS line by more than the offset voltage, and a fault determination circuit receiving as input the first and second input signals and generating a fault flag to indicate presence of a fault if the first and second input signals remain at a same logic level.

The LVDS fault detection circuit includes first and second comparators. The first comparator has a non-inverting terminal receiving input from the first LVDS line as modified by the offset voltage, an inverting terminal receiving input from the second LVDS line, and an output generating the first input signal for the fault determination circuit. The second comparator has a non-inverting terminal receiving input from the second LVDS line as modified by the offset voltage, an inverting terminal receiving input from the first LVDS line, and an output generating the second input signal for the fault determination circuit. During presence of the fault, the first and second input signals for the fault determination circuit as produced at the outputs of both the first and second comparators are pulled high due to the offset voltages at the non-inverting terminals of the first and second comparators being greater than voltages at the inverting terminals of the first and second comparators.

The fault determination circuit includes a first PMOS transistor having a source coupled to a supply node, a drain coupled to a capacitive node, and a gate coupled to the first input signal. The fault determination circuit also includes a second PMOS transistor having a source coupled to the supply node, a drain coupled to the capacitive node, and a gate coupled to the second input signal. The first input signal being pulled low turns on the first PMOS transistor and the second input signal being pulled low turns on the second PMOS transistor, thereby charging the capacitive node. The first input signal being high turns off the first PMOS transistor and the second input signal being high turns off the second PMOS transistor. A discharge circuit is coupled to the capacitive node. The first and second PMOS transistors being turned off allows the discharge circuit to discharge the capacitive node. A Schmitt trigger is coupled to receive input from the capacitive node and configured to generate the fault flag if the charge on the capacitive node falls below a threshold level.

The discharge circuit includes a leakage current generator coupled between the capacitive node and ground, and a capacitor coupled in parallel with the leakage current generator between the capacitive node and ground. A leakage current generated by the leakage current generator serves to discharge the capacitor to below the threshold level over time in an absence of switching at the gate of the first and second PMOS transistors.

A differential RC circuit may be coupled between first and second LVDS lines and the first and second inputs, and may be configured to attenuate transient differential voltages in a fault case where one LVDS line is cut.

A common mode voltage generation circuit may be coupled to the first and second LVDS lines upstream of the first and second inputs. The first and second LVDS lines provide the first and second input signals. The common mode voltage generation circuit generates a common mode voltage between the first and second LVDS lines when both the first and second LVDS lines are open upstream of the common mode voltage generation circuit.

Either of the comparators may include the following: a third PMOS transistor having a source coupled to a supply node through an offset resistor, a drain, and a gate coupled to the drain of the third PMOS transistor; a fourth PMOS transistor having a source coupled to the supply node, a drain, and a gate coupled to the gate of the third PMOS transistor; a first NMOS transistor having a drain coupled to the drain of the third PMOS transistor, a source coupled to a tail, and a gate forming the inverting terminal of the first comparator; and a second NMOS transistor having a drain coupled to the drain of the fourth PMOS transistor, a source coupled to the tail, and a gate forming the non-inverting terminal of the first comparator, with the drain of the fourth PMOS transistor forming the output of the first comparator.

As an alternative, either of the comparators may include the following: a third PMOS transistor having a source coupled to a supply node, a drain, and a gate coupled to the drain of the third PMOS transistor; a fourth PMOS transistor having a source coupled to the supply node, a drain, and a gate coupled to the gate of the third PMOS transistor; a first NMOS transistor having a drain coupled to the drain of the third PMOS transistor, a source coupled to a tail, and a gate forming the inverting terminal of the second comparator; and a second NMOS transistor having a drain coupled to the drain of the fourth PMOS transistor, a source coupled to the tail through an offset resistor, and a gate forming the non-inverting terminal of the second comparator, with the drain of the fourth PMOS transistor forming the output of the second comparator.

The LVDS fault detection circuit is independent of a LVDS receiver coupled to the first and second LVDS lines.

BRIEF DESCRIPTION OF THE DRAWINGS

FIG. 1A shows the voltage waveforms of the two lines of a LVDS system switching during normal operation.

FIG. 1B shows the differential voltage between the two lines of FIG. 1A during normal operation, when switching to transmit data.

FIG. 1C shows the DC voltages on the two lines of a LVDS system when transmitting a logic high, and the resulting differential voltage between those two lines.

FIG. 1D shows the DC voltages on the two lines of a LVDS system when transmitting a logic low, and the resulting differential voltage between those two lines.

FIG. 1K shows the voltage waveforms of the two lines of a LVDS system during normal operation at low frequency, as well as the outputs of the window comparator of FIG. 1J during normal operation at low frequency.

FIG. 1L shows the voltage waveforms of the two lines of a LVDS system during a fault condition at low frequency in which one line is cut, as well as the outputs of the window comparator of FIG. 1J during that fault condition.

FIG. 1M shows the voltage waveforms of the two lines of a LVDS system during normal operation at high frequency, as well as the outputs of the window comparator of FIG. 1J during operation at high frequency.

FIG. 3 is a schematic diagram of a possible design for the comparators of FIG. 2.

FIG. 4 is a schematic diagram of another possible design for the comparators of FIG. 2.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
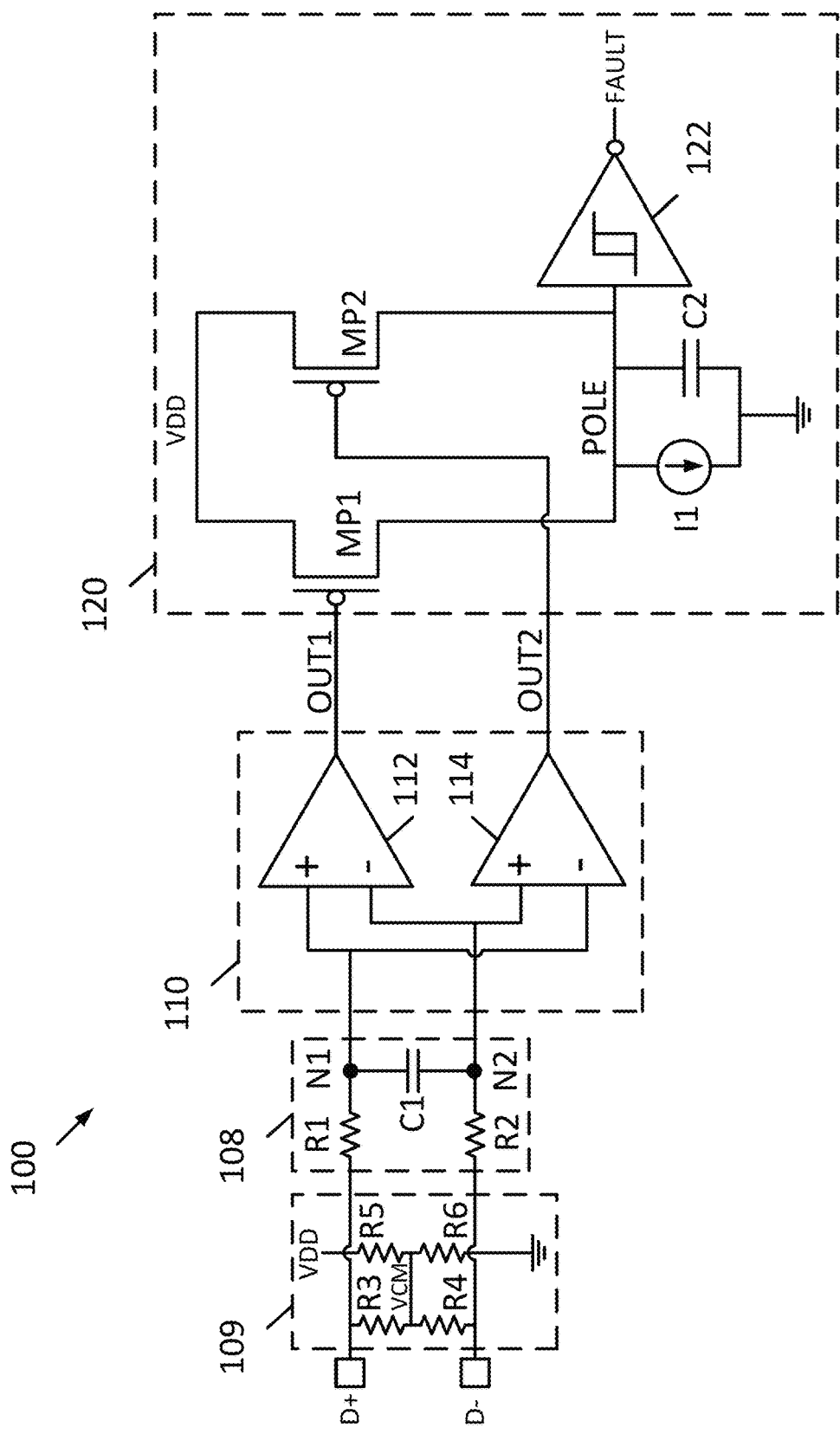
FIG. 2 is a schematic diagram of a window comparison system in accordance with this disclosure.

FIG. 2 shows a circuit diagram for a window comparison system 100 for detecting faults on LVDS lines D+ and D−. The window comparison system 100 comprises a window comparator 110 with a voltage offset that drives a low power fault detection circuit 120 that operates like a logic gate for the output signals of the window comparator 110 as they transition between logic states. The window comparison system 100 includes an optional filter circuit 108 coupled to the inputs of the window comparator 110 and an optional common mode generation circuit 109 coupled between the LVDS lines D+ and D− and the optional filter circuit 108.

The optional common mode generation circuit 109 includes resistors R3 and R4 coupled in series between input pads for the LVDS lines D+ and D−, resistors R5 and R6 coupled in series between the supply node VDD and ground, and a central node coupling the central tap between resistors R3 and R4 to the central tap between resistors R5 and R6.

The optional filter circuit 108 forms a differential RC filter coupled to the LVDS lines D+ and D−, and includes a first resistor R1 coupled between the LVDS line D+ and node N1, a second resistor R2 coupled between the LVDS line D− and node N2, and a capacitor C1 coupled between nodes N1 and N2.

The window comparator 110 includes first and second comparators 112 and 114. The first comparator 112 has a non-inverting terminal coupled to node N1 to receive data from the D+ line, and an inverting terminal coupled to node N2 to receive data from the D− line. The second comparator 114 has a non-inverting terminal coupled to node N2 to receive data from the D− line and an inverting terminal coupled to node N1 to receive data from the D+ line. It is noted that both comparators 112 and 114 have internal voltage offsets coupled in series with their non-inverting terminals (not explicitly shown, see FIG. 1J for example).

The low power fault detection circuit 120 includes PMOS transistors MP1 and MP2 having their sources coupled to a power supply node VDD and their drains coupled to node POLE. The gate of PMOS transistor MP1 is coupled to the output of comparator 112, while the gate of PMOS transistor MP2 is coupled to the output of comparator 114. A current source I1 and capacitor C2 are coupled in parallel between node POLE and ground. A Schmitt trigger 122 has its input coupled to node POLE, and outputs a flag FAULT indicating detection of a fault with one or both of the LVDS lines D+ and D−.

In operation, the window comparator 110 serves to detect whether the absolute value of the differential voltage between D+ and D− is less than the offset voltage, which can be mathematically represented as:

$$|D+−D−| < \text{Offset Voltage}$$

In greater detail, the comparator 112 determines whether the difference between the LVDS lines D+ and D− is greater than the offset voltage, and pulls its output signal OUT1 high if so. The comparator 114 determines whether the difference between the LVDS lines D− and D+ is greater than the offset voltage, and pulls its output signal OUT2 high if so.

The low power fault detection circuit 120 determines whether the absolute value of the differential voltage between the LVDS lines D+ and D− is less than the offset voltage. If the absolute value of this differential voltage is less than the offset voltage, then the flag FAULT generated by the Schmitt trigger 122 will be high, indicating a fault with the LVDS lines D+ and D−. If the absolute value of this differential voltage is not less than the offset voltage, then the flag FAULT will be low, indicating a lack of fault with the LVDS lines D+ and D−.

In greater detail, when fault is not present on the LVDS lines D+ and D−, the difference between either the LVDS lines D+ and D−, or between the LVDS lines D− and D+ will be greater than the offset voltage. Therefore, the outputs OUT1 and OUT2 of the comparators 112 and 114 will have large swings, with only one of the comparators 112 and 114 pulling OUT1 or OUT2 high except during transition. This means that, except during transition, either PMOS transistor MP1 or PMOS transistor MP2 will be on, maintaining an average current sufficient to pull node POLE to VDD and charging capacitor C2 to a logic high to prevent the Schmitt trigger 122 from pulling the flag FAULT high. During the period of transition, while neither OUT1 nor OUT2 is high, both PMOS transistors MP1 and MP2 will be off, and the leakage current I1 will start to discharge capacitor C2. However, this transition period is typically short, so capacitor C2 will maintain enough charge to keep the node POLE at a voltage level corresponding to a logic high, thus preventing the Schmitt trigger 122 from pulling the flag FAULT high.

When a fault is present on one or more of the LVDS lines D+ and D− (i.e., the absolute value of the differential voltage is lower than the offset voltage, meaning that both the difference between D+ and D−, as well as the difference between D− and D+, will be lower than the offset voltage), due to the offsets, both OUT1 and OUT2 will be at a logic high. As a result, both PMOS transistors MP1 and MP2 are kept off, and the leakage current I1 then discharges capacitor C2 to ground over time. This discharges the voltage at node POLE. When the voltage on capacitor C2 decays sufficiently, for example corresponding to a logic low, the Schmitt trigger 122 will pull the flag FAULT high to indicate a fault with the LVDS lines D+ and D−.

Note that the Schmitt trigger 122 serves to filter out transient glitches at the POLE node (due to switching at nearby nodes or space radiations) and prevent false reporting of a fault. Possible designs of the comparators 112 and 114 are now described with additional reference to FIGS. 3-4. Generally, both comparators 112 and 114 will be of the same type, but in some instances they may be of different types.

One possible comparator design for either or both of the comparators 112 and 114 is shown in FIG. 3. Here, PMOS transistors P1 and P2 are in a current mirroring relationship, with the source of the PMOS transistor P1 being coupled to the power supply node VDD through the resistor R and the drain of the PMOS transistor P1 being coupled to its gate, and with the source of the PMOS transistor P2 being coupled to the power supply node VDD and the gate of the PMOS transistor P2 being coupled to the gate of the PMOS transistor P1.

The drains of the PMOS transistors P1 and P2 are coupled to the drains of NMOS transistors N1 and N2. NMOS transistors N1 and N2 have their sources coupled to the tail current source Itail, the gate of NMOS transistor N1 forms the inverting input IN− of the comparator, and the gate of the NMOS transistor N2 forms the non-inverting input IN+ of the comparator. The output of the comparator OUT is taken at the drain of NMOS transistor N2 and the drain of PMOS transistor P2. In operation, if the difference between the voltage at input IN+ and the voltage at IN− is greater than the offset (set by the resistance of resistor R), the output OUT will be pulled to a voltage much lower than the supply voltage, but if that difference is less than the offset, the output OUT will be pulled high. In some instances, the voltage drop across the resistor R can vary with VDD, temperature and process. This can in theory lead to a gray area between being able to clearly distinguish a faulty differential voltage VOD from a normal differential VOD on the lines, although the numerous benefits provided by the designs described herein outweigh any risk resulting from this potential grey area.

Another possible comparator design for either or both of 112 and 114 is shown in FIG. 4. Here, PMOS transistors P1 and P2 are in a current mirroring relationship, with the source of the PMOS transistor P1 being coupled to the power supply node VDD and the drain of the PMOS transistor P1 being coupled to its gate, and with the source of the PMOS transistor P2 being coupled to the power supply node VDD and the gate of the PMOS transistor P2 being coupled to the gate of the PMOS transistor P1.

The drains of the PMOS transistor P1 and P2 are coupled to the drains of the NMOS transistors N1 and N2. The NMOS transistor N1 has its source coupled to the tail current source Itail, while the NMOS transistor N2 has its source coupled to the tail current source Itail through resistor R. The gate of the NMOS transistor N1 forms the inverting input IN− of the comparator, and the gate of the NMOS transistor N2 forms the non-inverting input IN+ of the comparator. The output of the comparator OUT is taken at the drain of NMOS transistor N2 (also the drain of PMOS transistor P2). In operation, if the difference between the voltage at input IN+ and the voltage at IN− is greater than the offset (set by the resistance of resistor R), the output OUT will be pulled to a voltage much lower than the supply voltage, but if that difference is less than the offset, the output OUT will be pulled high.

Referring back to FIG. 2, a special fault case is present where one LVDS signal line is cut but the other LVDS signal line continues to pulse. For example, referring back to FIG. 1G, a graph of the voltages of the LVDS lines D+ and D−, as well as the differential voltage VOD between the LVDS lines D+ and D−, is shown in a fault mode where the D+ line has been cut but the D− line continues to pulse. Here, it can be seen that the voltage at the D+ line does not follow the voltage at the D− line as would be expected in this scenario, but is instead delayed with respect to the voltage at the D− line. This results in a momentary differential voltage VOD that may be greater than the threshold voltage. As explained, the differential RC filter 108 serves to help filter out this momentary differential voltage VOD so that a false positive (lack of fault) is not otherwise indicated. The values of resistors R1 and R2 and capacitor C1 in the differential filter 108 are small enough to not cause significant degradation of effective VOD seen by the comparators 112 and 114 or the main receiver during normal operation.

Another fault case is present where both LVDS lines are cut. In this case, the purpose of the common mode generation circuit 109 is to generate a weak common mode voltage VCM between the LVDS lines D+ and D− downstream of the cut, so that the comparators 110 operate in their common mode range.

This design of the window comparison system 100 provides for a variety of advantages. For example, the design of the window comparison system 100 is independent of any LVDS receiver, and does not receive any feedback from the main LVDS receiver, therefore the hysteresis of the LVDS receiver and sensitivity of the LVDS receiver are not factors. In addition, the window comparison system 100 does not degrade performance of the LVDS receiver. Also, the dedicated flag FAULT can be used for making the receiver fail safe, preventing the output of the receiver from toggling due to faulty lines. Moreover, since the window comparison system 100 is continuously monitoring the LVDS lines and is independent of the LVDS receiver, faults can be reported at any time (on the fly), including during data communication. Still further, the fault detection performed by the window comparison system 100 does not require any prior hand-shaking between the two ends of the LVDS link and is immune to a wide range of common-mode signal levels. Even further, the capability of detecting a fault in a single LVDS line provided by the window comparison system 100 is useful, as it is not reliably possible in the prior art design mentioned before.

The flag FAULT can be used by other components receiving data via the LVDS, such as a system on a chip (SOC). Since there may be multiple LVDS data links each with their own window comparison system 100, a SOC can monitor the flags FAULT from each window comparison system 100, and select only the working LVDS data links for use, or a subset of the working LVDS data links, and then power down the remainder of the LVDS data links so as to conserve power.

Figure 1E:
FIG. 1E shows the DC voltages of the two lines of a LVDS system during a faulty condition in which both lines are cut.
Figure 1F:
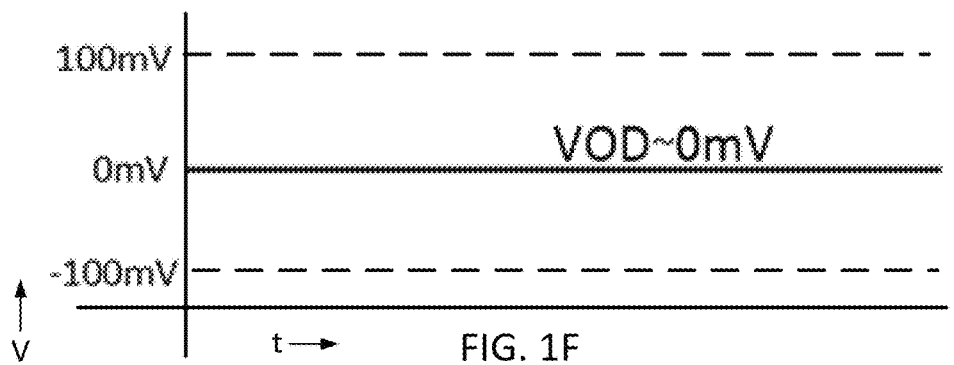
FIG. 1F shows the differential voltages between the two lines of FIG. 1E during the faulty condition.
Figure 1G:
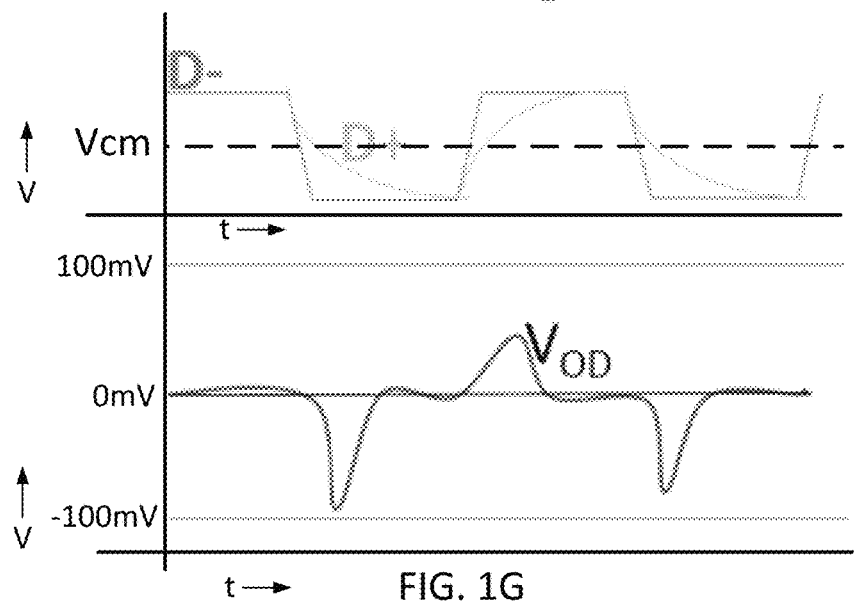
FIG. 1G shows the voltage waveforms of the two lines of a LVDS system during a faulty condition in which the lines are switching at high frequency and one of the lines is cut, as well as the differential voltages between those two lines during that faulty condition.
Figure 1H:
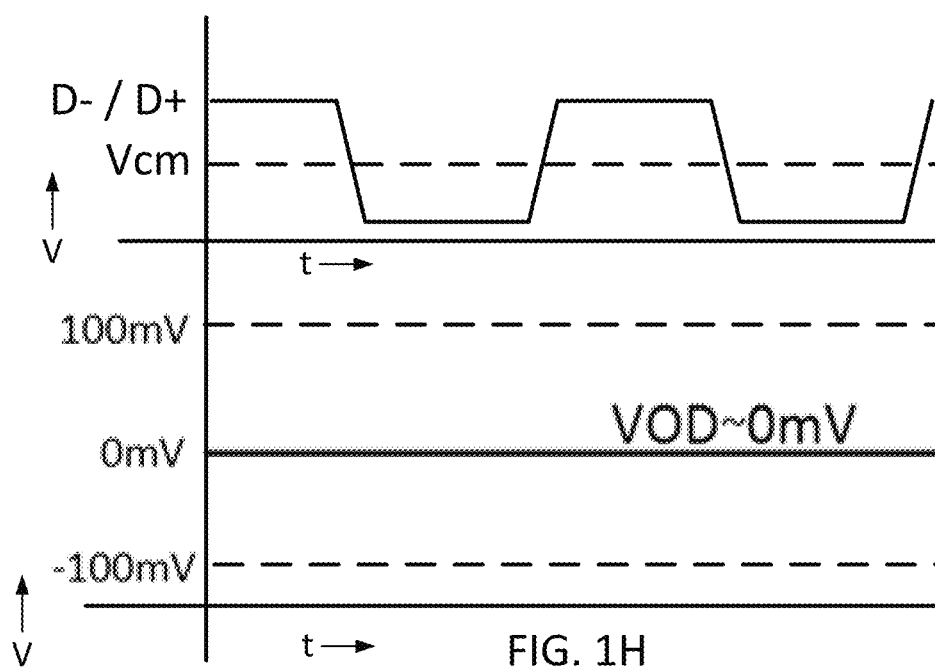
FIG. 1H shows the voltage waveforms of the two lines of a LVDS system during a faulty condition in which the lines are switching at low frequency and one of the lines is cut, as well as the differential voltages between those two lines during that faulty condition.
Figure 1I:
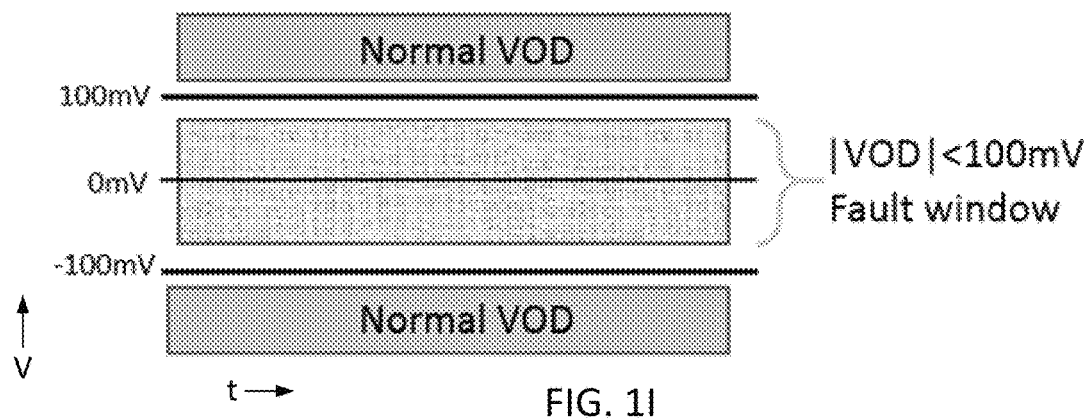
FIG. 1I shows the fault window detected by a window comparator for a LVDS system.
Figure 1J:
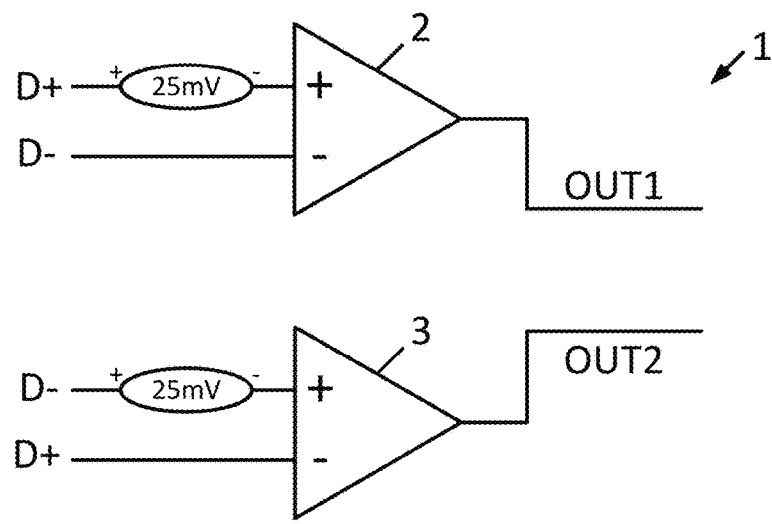
FIG. 1J is a schematic block diagram showing a known window comparator for a LVDS system.
Figure 1N:
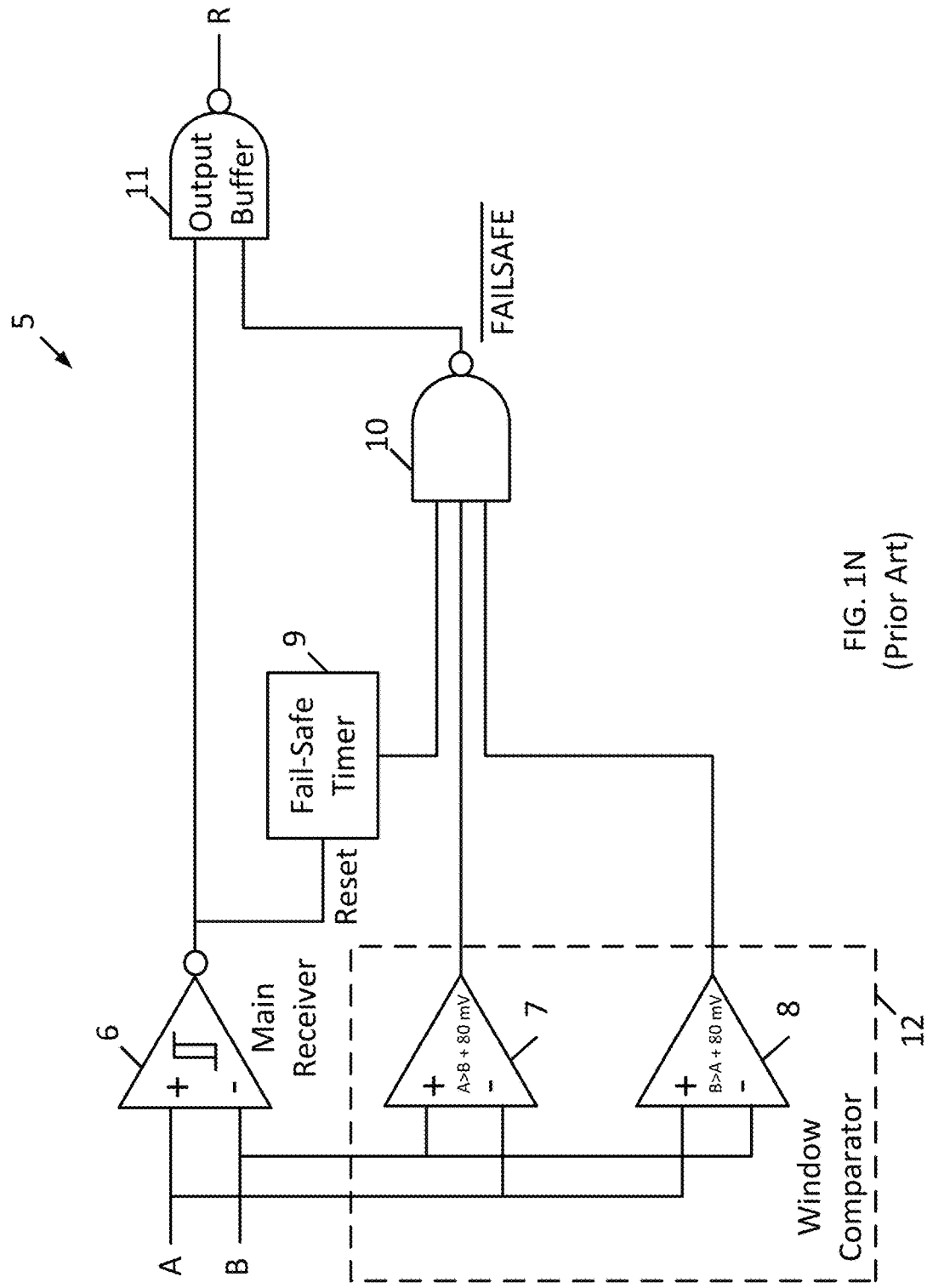
FIG. 1N shows a known window comparison circuit that aims to avoid the issues with the window comparator of FIG. 1J at high frequency that were highlighted by FIG. 1M.

Another main advantage of this design is that it is capable of accurate operation even when the signal is switching fast (beyond the bandwidth of the comparators used). As shown in FIG. 1M, if the signal is switching beyond the bandwidth of the comparators used, despite operating conditions being normal, OUT1 and OUT2 are considered high, and would be misinterpreted as a fault by prior art window comparators (and the NAND gates typically following those window comparators). However, observing FIG. 1M closely, OUT1 and OUT2 do have some swing around VDD, and this low power fault detection circuit 120 is sensitive enough to pick up this swing and correctly report this as normal. For thus functionality, as explained, the PMOS transistors MP1 and MP1 turn on just enough to overcome the discharge of the POLE node by current I1. If instead of the design for the low power fault detection circuit 120, a normal logic gate (such as a NAND, NOR, or XOR gate) having sufficient bandwidth were used to determine fault from the OUT1 and OUT2 signals, the window comparator would have consumed an undesirable amount of power to respond properly to fast switching signals on D+ and D− (with a reduced differential voltage due to offset).

In a case where one of the lines D+ or D− is cut, the momentary spike in VOD can sometimes be very high, particularly if the cut is far away from the main receiver. This spike can be smoothed out by the differential RC filter 108 to some extent, but if this proves to be insufficient, the offset voltage in the window comparators can be increased. As was seen earlier, higher offsets lead to further reduced swing at OUT1 and OUT2 nodes in normal mode. However, through the use of the highly sensitive lower power fault detection circuit 120 sensing the OUT1 and OUT2 signals, the use of such higher offsets can be afforded, enabling the tackling of the fault case where one of the lines is cut more efficiently.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A low voltage differential signaling (LVDS) fault detection circuit, comprising:
   a first input configured to receive a first input signal indicating whether a voltage at a first LVDS line is greater than a voltage at a second LVDS line by more than an offset voltage;
   a second input configured to receive a second input signal indicating whether the voltage at the second LVDS line is greater than the voltage at the first LVDS line by more than the offset voltage; and
   a fault determination circuit receiving the first and second input signals as inputs and configured to generate a fault flag to indicate presence of a fault if the first and second input signals remain at a same logic level for longer than a discharge time.

2. The LVDS fault detection circuit of claim 1, further comprising:
   a first comparator having a non-inverting terminal receiving input from the first LVDS line as modified by the offset voltage, an inverting terminal receiving input from the second LVDS line, and an output generating the first input signal for the fault determination circuit;
   a second comparator having a non-inverting terminal receiving input from the second LVDS line as modified by the offset voltage, an inverting terminal receiving input from the first LVDS line, and an output generating the second input signal for the fault determination circuit;
   wherein during presence of the fault, the first and second input signals for the fault determination circuit as produced at the outputs of both the first and second comparators are pulled high due to the offset voltages at the non-inverting terminals of the first and second comparators being greater than voltages at the inverting terminals of the first and second comparators.

3. The LVDS fault detection circuit of claim 2, wherein the fault determination circuit comprises:
   a first PMOS transistor having a source coupled to a supply node, a drain coupled to a capacitive node, and a gate coupled to the first input signal;
   a second PMOS transistor having a source coupled to the supply node, a drain coupled to the capacitive node, and a gate coupled to the second input signal;
   wherein the first input signal being pulled low turns on the first PMOS transistor and the second input signal being pulled low turns on the second PMOS transistor, thereby charging the capacitive node;
   wherein the first input signal being high turns off the first PMOS transistor and the second input signal being high turns off the second PMOS transistor;
   a discharge circuit coupled to the capacitive node;
   wherein the first and second PMOS transistors being turned off allows the discharge circuit to discharge the capacitive node over said discharge time; and
   a Schmitt trigger coupled to receive input from the capacitive node and configured to generate the fault flag if the charge on the capacitive node falls below a threshold level.

4. The LVDS fault detection circuit of claim 3, wherein the discharge circuit comprises:
   a leakage current generator coupled between the capacitive node and ground;
   a capacitor coupled in parallel with the leakage current generator between the capacitive node and ground; and
   wherein a leakage current generated by the leakage current generator serves to discharge the capacitor to below the threshold level over said discharge time in an absence of switching at the gate of the first and second PMOS transistors.

5. The LVDS fault detection circuit of claim 1, further comprising a differential RC circuit coupled between first and second LVDS lines and the first and second inputs, the differential RC circuit configured to attenuate transient differential voltages in a fault case where one LVDS line is cut.

6. The LVDS fault detection circuit of claim 1, further comprising a common mode voltage generation circuit coupled to the first and second LVDS lines upstream of the first and second inputs, the first and second LVDS lines providing the first and second input signals, the common mode voltage generation circuit configured to generate a common mode voltage between the first and second LVDS lines when both the first and second LVDS lines are open upstream of the common mode voltage generation circuit.

7. The LVDS fault detection circuit of claim 2, wherein the first comparator comprises:
   a third PMOS transistor having a source coupled to a supply node through an offset resistor, a drain, and a gate coupled to the drain of the third PMOS transistor;
   a fourth PMOS transistor having a source coupled to the supply node, a drain, and a gate coupled to the gate of the third PMOS transistor;
   a first NMOS transistor having a drain coupled to the drain of the third PMOS transistor, a source coupled to a tail, and a gate forming the inverting terminal of the first comparator;
   a second NMOS transistor having a drain coupled to the drain of the fourth PMOS transistor, a source coupled to the tail, and a gate forming the non-inverting terminal of the first comparator; and
   wherein the drain of the fourth PMOS transistor forms the output of the first comparator.

8. The LVDS fault detection circuit of claim 2, wherein the second comparator comprises:
   a third PMOS transistor having a source coupled to a supply node, a drain, and a gate coupled to the drain of the third PMOS transistor;
   a fourth PMOS transistor having a source coupled to the supply node, a drain, and a gate coupled to the gate of the third PMOS transistor;
   a first NMOS transistor having a drain coupled to the drain of the third PMOS transistor, a source coupled to a tail, and a gate forming the inverting terminal of the second comparator;
   a second NMOS transistor having a drain coupled to the drain of the fourth PMOS transistor, a source coupled to the tail through an offset resistor, and a gate forming the non-inverting terminal of the second comparator; and
   wherein the drain of the fourth PMOS transistor forms the output of the second comparator.

9. The LVDS fault detection circuit of claim 1, wherein the LVDS fault detection circuit is independent of a LVDS receiver coupled to the first and second LVDS lines.

10. A low voltage differential signaling (LVDS) fault detection circuit, comprising:
    first and second LVDS lines;
    a window comparator having inputs coupled to the first and second LVDS lines and providing first and second outputs, the first output being pulled high if a difference between voltages at the first and second LVDS lines is greater than a threshold voltage, the second output being pulled high if a difference between the voltages at the second and first LVDS lines is greater than the threshold voltage;
    wherein, during presence of a fault, the first and second outputs of the window comparator will both be pulled high;
    a charge circuit coupled to a capacitive node and configured to charge the capacitive node when either the first output or the second output is low;
    a discharge circuit coupled to the capacitive node and configured to discharge the capacitive node when both the first output and the second output are pulled high; and
    a Schmitt trigger coupled to receive input from the capacitive node and configured to generate a fault flag indicating fault if the charge on the capacitive node falls below a threshold level.

11. The LVDS fault detection circuit of claim 10, wherein the discharge circuit discharges the capacitive node when both the first output and the second output are pulled high, such that the Schmitt trigger generates the fault flag if both the first output and the second output are pulled high to indicate fault.

12. The LVDS fault detection circuit of claim 10, wherein the charge circuit comprises:
    a first PMOS transistor having a source coupled to a supply node, a drain coupled to the capacitive node, and a gate coupled to the first output such that the first PMOS transistor is turned off when the first output is pulled high and such that the first PMOS transistor is turned on to charge the capacitive node when the first output is low; and a second PMOS transistor having a source coupled to the supply node, a drain coupled to the capacitive node, and a gate coupled to the second output such that the second PMOS transistor is turned off when the second output is pulled high and such that the second PMOS transistor is turned on to charge the capacitive node when the second output is low.

13. The LVDS fault detection circuit of claim 10, wherein the discharge circuit comprises:
a leakage current generator coupled between the capacitive node and ground;
a capacitor coupled in parallel with the leakage current generator between the capacitive node and ground; and
wherein a leakage current generated by the leakage current generator serves to discharge the capacitor to the threshold level without the charge circuit charging the capacitive node.

14. A low voltage differential signaling (LVDS) fault detection circuit, comprising:
a first input configured to receive a first input signal indicating whether a voltage at a first LVDS line is greater than a voltage at a second LVDS line;
a second input configured to receive a second input signal indicating whether the voltage at the second LVDS line is greater than the voltage at the first LVDS line; and
a charge-discharge circuit receiving as input the first and second input signals and configured to:
charge a capacitive node when either the first input signal or the second input signal is low;
discharge the capacitive node at a set discharge rate when neither the first input signal nor the second input signal is low, wherein the set discharge rate depends on capacitance of the capacitive node and a value of a leakage current flowing from the capacitive node to ground;
generate a fault flag indicating presence of a fault if charge on the capacitive node falls below a threshold level.

15. The LVDS fault detection circuit of claim 14, wherein the circuit charge-discharge comprises:
a first PMOS transistor having a source coupled to a supply node, a drain coupled to the capacitive node, and a gate coupled to the first input signal;
a second PMOS transistor having a source coupled to the supply node, a drain coupled to the capacitive node, and a gate coupled to the second input signal;
a discharge circuit coupled to the capacitive node; and
a Schmitt trigger coupled to receive input from the capacitive node and configured to generate the fault flag if the charge on the capacitive node falls to the threshold level.

16. The LVDS fault detection circuit of claim 15, wherein the charge-discharge circuit further comprises:
a leakage current generator coupled between the capacitive node and ground;
a capacitor coupled in parallel with the leakage current generator between the capacitive node and ground; and
wherein a leakage current generated by the leakage current generator serves to discharge the capacitor, and therefore the capacitive node, to the threshold level in an absence of current flowing from the first and second PMOS transistors into the capacitor.

17. The LVDS fault detection circuit of claim 14, further comprising a window comparator circuit coupled to the first and second LVDS lines and generating the first and second input signals therefrom.

18. The LVDS fault detection circuit of claim 14, further comprising a differential RC circuit coupled between first and second LVDS lines and the first and second inputs, the differential RC circuit configured to attenuate transient differential voltages in a fault case where one LVDS line is cut.

19. The LVDS fault detection circuit of claim 14, further comprising a common mode voltage generation circuit coupled to the first and second LVDS lines upstream of the first and second inputs, the first and second LVDS lines providing the first and second input signals, the common mode voltage generation circuit configured to generate a common mode voltage between the first and second LVDS lines regardless of whether one of the first and second LVDS lines is open upstream of the common mode voltage generation circuit.

20. A method of detecting faults on low voltage differential signaling (LVDS) lines, the method comprising:
receiving a first input signal indicating whether a voltage at a first LVDS line is greater than a voltage at a second LVDS line;
receiving a second input signal indicating whether the voltage at the second LVDS line is greater than the voltage at the first LVDS line;
charging a capacitive node when either the first input signal or the second input signal is low;
discharging the capacitive node at a set discharge rate when neither the first input signal nor the second input signal is low; and
generating a fault flag if charge on the capacitive node falls to the threshold level.

* * * * *